(12) United States Patent
Nagy

(10) Patent No.: US 11,381,194 B2
(45) Date of Patent: Jul. 5, 2022

(54) PROTECTIVE DEVICE FOR A SEMICONDUCTOR SWITCH OF AN ELECTRIC MOTOR OF AN ELECTROMECHANICAL MOTOR VEHICLE STEERING SYSTEM

(71) Applicants: thyssenkrupp Presta AG, Eschen (LI); thyssenkrupp AG, Essen (DE)

(72) Inventor: Gábor Nagy, Budapest (HU)

(73) Assignees: THYSSENKRUPP PRESTA AG, Eschen (LI); THYSSENKRUPP AG, Essen (DE)

( * ) Notice: Subject to any disclaimer, the term of this patent is extended or adjusted under 35 U.S.C. 154(b) by 0 days.

(21) Appl. No.: 17/252,437

(22) PCT Filed: Jun. 18, 2019

(86) PCT No.: PCT/EP2019/065985
§ 371 (c)(1),
(2) Date: Dec. 15, 2020

(87) PCT Pub. No.: WO2019/243310
PCT Pub. Date: Dec. 26, 2019

(65) Prior Publication Data
US 2021/0273597 A1    Sep. 2, 2021

(30) Foreign Application Priority Data

Jun. 21, 2018  (DE) ............... 10 2018 114 977.8

(51) Int. Cl.
*H03K 17/081* (2006.01)
*H02P 29/024* (2016.01)
*B62D 5/04* (2006.01)

(52) U.S. Cl.
CPC ........ *H02P 29/0241* (2016.02); *B62D 5/0484* (2013.01)

(58) Field of Classification Search
CPC . H02P 29/0241; H02P 29/032; B62D 5/0484; H02M 7/53875; H02H 7/0805; H02H 7/0838; H03K 17/08142
See application file for complete search history.

(56) References Cited

U.S. PATENT DOCUMENTS

| | | | |
|---|---|---|---|
| 9,054,618 B2 * | 6/2015 | Frank | H02M 1/32 |
| 10,855,183 B1 * | 12/2020 | Barrenscheen | H02M 1/32 |
| 2003/0025546 A1 | 2/2003 | Ikeda | |

(Continued)

FOREIGN PATENT DOCUMENTS

| | | |
|---|---|---|
| CN | 101981805 A | 2/2011 |
| CN | 103052557 A | 4/2013 |

(Continued)

OTHER PUBLICATIONS

English Translation of International Search Report issued in PCT/EP2019/065985, dated Aug. 27, 2019.

(Continued)

*Primary Examiner* — Muhammad S Islam
(74) *Attorney, Agent, or Firm* — thyssenkrupp North America, LLC

(57) ABSTRACT

An electromechanical motor vehicle power steering system having a multiphase, permanently excited electric motor via a controller and supply lines from an onboard power supply of a motor vehicle.

14 Claims, 5 Drawing Sheets

(56) References Cited

U.S. PATENT DOCUMENTS

| | | |
|---|---|---|
| 2005/0190514 A1 | 9/2005 | Walters |
| 2011/0025238 A1 | 2/2011 | Ueda et al. |
| 2013/0113405 A1 | 5/2013 | Baranyai |
| 2013/0140104 A1 | 6/2013 | Dzsudzsak |
| 2016/0052541 A1 | 2/2016 | Nakayama et al. |
| 2016/0141865 A1* | 5/2016 | Drake ................. H02H 7/0822 318/445 |
| 2016/0181953 A1 | 6/2016 | Oyama |
| 2016/0336733 A1* | 11/2016 | Li ........................... H02H 3/20 |
| 2017/0179941 A1* | 6/2017 | Desel ................... H01L 27/088 |

FOREIGN PATENT DOCUMENTS

| | | |
|---|---|---|
| CN | 103108794 A | 5/2013 |
| CN | 105163999 A | 12/2015 |
| DE | 102011055626 A | 8/2013 |
| DE | 11 2014 003 605 T | 5/2016 |
| EP | 2 417 002 B | 6/2013 |

OTHER PUBLICATIONS

Jim Lepkowski, Semiconductor et al.: "An Introduction to Transient Voltage Suppression Devices", pp. 1-8 (Jul. 2005).

\* cited by examiner

PROTECTIVE DEVICE FOR A SEMICONDUCTOR SWITCH OF AN ELECTRIC MOTOR OF AN ELECTROMECHANICAL MOTOR VEHICLE STEERING SYSTEM

CROSS REFERENCE TO RELATED APPLICATIONS

This application is a U.S. National Stage Entry of International Patent Application Serial Number PCT/EP2019/065985, filed Jun. 18, 2019, which claims priority to German Patent Application No. DE 10 2018 114 977.8, filed Jun. 21, 2018, the entire contents of both of which are incorporated herein by reference.

FIELD

The present disclosure generally relates to an electromechanical motor vehicle power steering system.

BACKGROUND

Electromechanical steering systems usually have a permanently excited synchronous motor as a servomotor. Servomotors of this design are actuated by a controller via a set of MOSFETs, wherein when there are three phase windings a total of six MOSFETs are provided. At each MOSFET the assigned phase winding is connected to the onboard power supply voltage or to the ground potential. This is done at a high frequency, so that the chronological mean value acts as an effective voltage in the phase winding.

Permanently excited synchronous motors have the property of generating a breaking torque when electrical faults occur, such as for example when short circuits occur in the motor or in the actuation system, so that such a fault cannot only bring about failure of the steering assistance but the steering movement of the driver is also opposed by an additional resistance. For safety reasons, this cannot be tolerated in steering systems for motor vehicles.

It is known to separate the phase supply lines to the motor or at the starpoint of the motor in order to avoid this state.

Semiconductor switches are proposed for this purpose in the prior art. In this context, overvoltages may occur when the switching elements are opened, owing to the continuously present leakage conductances in the inverter. If the flow of current is interrupted by a semiconductor switch, the voltage at the semiconductor switch between the drain and source rises to a value which can be higher than the supply voltage. If the voltage which occurs in this case exceeds the maximum reverse voltage of the semiconductor switch, the semiconductor switch can be destroyed. An excessively high flow of current through the semiconductor switch during the switching off process must therefore be avoided in order to protect the semiconductor switch against damage.

Thus, a need exists for an electromechanical motor vehicle power steering system with a protective device for a semiconductor switch for protecting against overvoltages, which device protects the semiconductor switch against damage when the line is disconnected.

DETAILED DESCRIPTION

Figure 1:
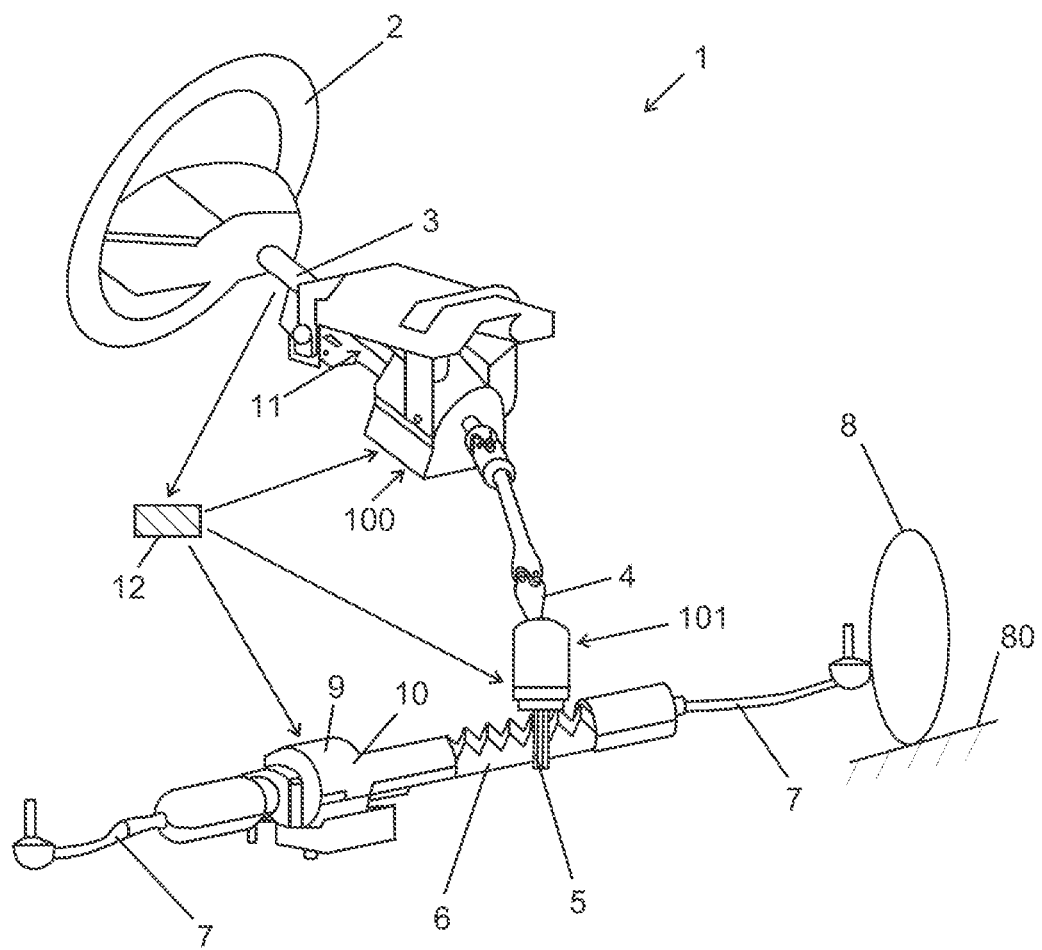
FIG. 1 is a schematic view of an electromechanical power steering system with a plurality of possibilities for the arrangement of the servomotor.

Although certain example methods and apparatus have been described herein, the scope of coverage of this patent is not limited thereto. On the contrary, this patent covers all methods, apparatus, and articles of manufacture fairly falling within the scope of the appended claims either literally or under the doctrine of equivalents. Moreover, those having ordinary skill in the art will understand that reciting "a" element or "an" element in the appended claims does not restrict those claims to articles, apparatuses, systems, methods, or the like having only one of that element, even where other elements in the same claim or different claims are preceded by "at least one" or similar language. Similarly, it should be understood that the steps of any method claims need not necessarily be performed in the order in which they are recited, unless so required by the context of the claims. In addition, all references to one skilled in the art shall be understood to refer to one having ordinary skill in the art.

The present invention relates to an electromechanical motor vehicle power steering system.

Accordingly, an electromechanical motor vehicle power steering system is provided having a multiphase, permanently excited electric motor which can be operated via a controller and supply lines from an onboard DC power supply of a motor vehicle, wherein the electric motor has at least three phase windings which are connected to a driver circuit via lines, wherein the driver circuit connects each of the lines to the positive supply line via a respectively first MOSFET of a first group and to the negative supply line via a respectively second MOSFET of a second group, in accordance with the controller, and wherein each line has a MOSFET as a safety switch which is arranged with a body diode in the forward conducting direction with respect to the onboard power supply, and wherein each safety switch has a protective device which comprises at least one suppressor diode which is connected in parallel with the respective safety switch and arranged in the forward conducting direction with respect to the onboard DC power supply, and for each phase winding a diode which is connected in series with respect to the at least one suppressor diode and in the reverse direction with respect to the onboard power supply. The suppressor diode can conduct overvoltages past the safety switch and therefore prevent damage during the switching process. The diodes which are connected in the reverse direction with respect to the onboard power supply prevent an induction current short-circuiting the phases and prevent the current from flowing in the direction of the phases.

The at least one suppressor diode is preferably unidirectional. The at least one suppressor diode is preferably configured in such a way that when an induction current which exceeds a voltage threshold is present, the suppressor diode conducts the inductance current, and therefore the current is conducted past the safety switches.

The MOSFETs of the first group and of the second group are preferably arranged with their body diodes in the reverse direction with respect to the onboard DC power supply.

The diodes of the protective device which are connected in the blocking device with respect to the onboard power supply are preferably Schottky diodes which have virtually no storage charge and are therefore very rapid.

There is preferably provision that the protective devices are arranged in current conducting paths, which connect the positive supply line or the negative supply line to a common connecting point of the corresponding safety switch and of the associated motor winding.

The electromechanical motor vehicle power steering system can have, for each phase winding, a suppressor diode in the current conducting paths, or a single suppressor diode which is arranged upstream of a common connecting point of the current conducting paths. The use of a single suppressor diode is more cost-effective. Depending on the power of the motor, it is necessary to decide whether a single suppressor diode is sufficient or whether one suppressor diode per phase winding has to be used.

The electric motor preferably has three phases and is permanently excited.

FIG. 1 is a schematic illustration of an electromechanical motor vehicle power steering system 1 having a steering wheel 2, which is coupled in a rotationally fixed fashion to an upper steering shaft 3. The driver applies a corresponding torque as a steering command into the steering shaft 3 via the steering wheel 2. The torque is then transmitted to a steering pinion 5 via the upper steering shaft 3 and lower steering shaft 4. The pinion 5 meshes in a known fashion with a tooth segment of a toothed rack 6. The toothed rack 6 is mounted in a steering housing so as to be displaceable in the direction of its longitudinal axis. At its free end, the toothed rack 6 is connected to track rods 7 via ball joints (not illustrated). The track rods 7 themselves are connected to, in each case, one steered wheel 8 of the motor vehicle in a known fashion via steering knuckles. A rotation of the steering wheel 2 brings about, via the connection of the steering shaft 3 and of the pinion 5, a longitudinal displacement of the toothed rack 6 and therefore pivoting of the steered wheels 8. The steered wheels 8 experience, via a roadway 80, a reaction which counteracts the steering movement. In order to pivot the wheels 8, a force is consequently necessary which makes a corresponding torque at the steering wheel 2 necessary. An electric motor 9 of a servo unit 10 is provided in order to assist the driver during this steering movement. The upper steering shaft 3 and the lower steering shaft 4 are coupled in a rotationally elastic fashion to one another via a torsion rod (not shown). A torque sensor unit 11 senses the torsion of the upper steering shaft 3 with respect to the lower steering shaft 4 as a measure of the torque, which is manually applied to the steering shaft 3 or to the steering wheel 2. A control unit 12 calculates, as a function of the torque measured by the torque sensor unit 11, the steering assistance, which is made available for the driver by the servo unit 10. The servo unit 10 can be coupled here as a power assistance device 10, 100, 101 either to a steering shaft 3, the steering pinion 5 or the toothed rack 6. The respective power assistance system 10, 100, 101 inputs an auxiliary torque into the steering shaft 3, the steering pinion 5 and/or into the toothed rack 6, as a result of which the driver is assisted in the steering work. The three different power assistance devices 10, 100, 101 illustrated in FIG. 1 show alternative positions for their arrangement. Usually just one of the shown positions is occupied by a power assistance system.

Figure 2:
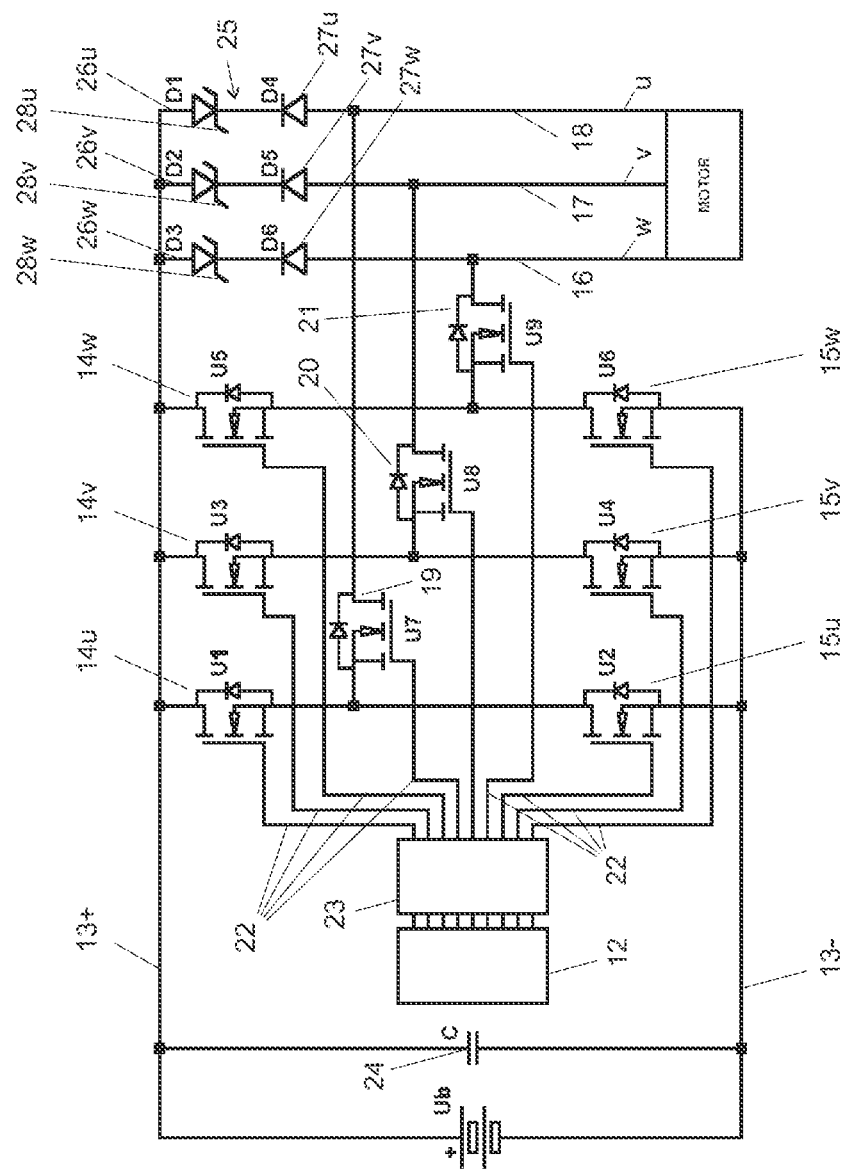
FIG. 2 is a circuit for actuating a permanently excited synchronous motor with six MOSFETs for controlling the motor current and a protective device.

FIG. 2 shows the basic circuit of a power component of the control unit 12. The supply line 13+ is connected to the positive pole of the supply line, and the supply line 13− is connected to the negative pole of the supply line or to the ground connection of the onboard electrics of the motor vehicle, which usually operate with DC voltage with negative ground. A first group of MOSFETs 14 comprises three MOSFTs 14$u$, 14$v$ and 14$w$ for applying the onboard voltage to the three phase windings u, v and w. A second group 15 of a total of three further MOSFETs 15$u$, 15$v$ and 15$w$ is provided for applying the ground potential to the phase windings u, v and w. For this, the two groups 14 and 15 feed as total of three lines 16, 17 and 18 which are each assigned to a phase u, v, w.

The MOSFETs of the first group 14 and of the second group 15 are provided as drivers. These driver MOSFETs of the groups 14 and 15 are usually connected in such a way that their intrinsic diodes or body diodes are connected in the reverse direction with respect to the onboard voltage. Depending on the control signals, they connect the individual phase windings u, v and w either to the positive potential or to the ground potential. This is done at a high frequency so that the chronological mean value is effective in the individual windings u, v and w as an operating voltage for generating an assistance torque.

Finally, a smoothing capacitor 24, which suppresses high-frequency reactions from the electric motor and the MOSFETs arranged upstream thereof, is provided between the two supply lines 13+ and 13−.

A MOSFET of a third group is provided as a safety switch 19, 20, 21 in each of the three lines 16, 17 and 18. The body diodes of the MOSFETs of the third group are connected in the forward conducting direction with respect to the onboard voltage and are therefore orientated counter to the diodes of the MOSFETs of the first and second groups 14, 15. This means during operation that the individual MOSFETs of the third group are continuously switched to a conductive mode as long as the steering device is active and no disruption occurs. In the case of a short-circuited smoothing capacitor 24, the two lines 13+ and 13− are conductively connected to one another. In this case, in the event of rotation of the electric motor caused by the external torque of the steering column, an induction voltage would come about in the windings u, v and w. The induction current flows out of a winding via the lines to the MOSFETs of the third group whose diodes are switched in the reverse direction. The circuit is interrupted here. No induction current flows.

The groups of MOSFETs are each actuated by means of a gate driver 23 via a control line 22. For this purpose, the necessary control signals are applied to the control electrodes (gates) of the individual MOSFETs.

Each safety switch 19, 20, 21 has a protective device 25. The protective devices 25 are arranged in current conducting paths 26$u$, 26$v$, 26$w$ which connect the supply line 13+, which is connected to the positive pole of the supply line, to a common connecting point of the corresponding semiconductor switch 19, 20, 21 and of the associated motor winding u, v, w (load). The protective device 25 comprises in each case a diode 27$u$, 27$v$, 27$w$ which is connected in the forward conducting direction of a possible induction current, and a unidirectional suppressor diode 28$u$, 28$v$, 28$w$ which is arranged in series with the latter and connected in the reverse direction of a possible induction current. Suppressor diodes, also referred to as transient voltage suppressor diodes (TVS), transient absorption Zener diodes (TAZ), transil diodes or breakover diodes (BOD), become conductive if a voltage threshold is exceeded. If a high induction current, at which the voltage threshold of the suppressor diodes is exceeded, occurs, the current is conducted through the parallel circuit at the corresponding safety switch 19, 20, 21.

The diode 27u, 27v, 27w, which is connected in series, is preferably a rapid Schottky diode which assumes a conductive state more quickly than the MOSFET of the corresponding safety switch goes into a nonconductive state. The diodes 27u, 27v, 27w prevent a short circuit occurring in the windings. In addition, they ensure that a current does not flow via the current conducting paths 26u, 26v, 26w in the direction of the motor windings.

Figure 3:
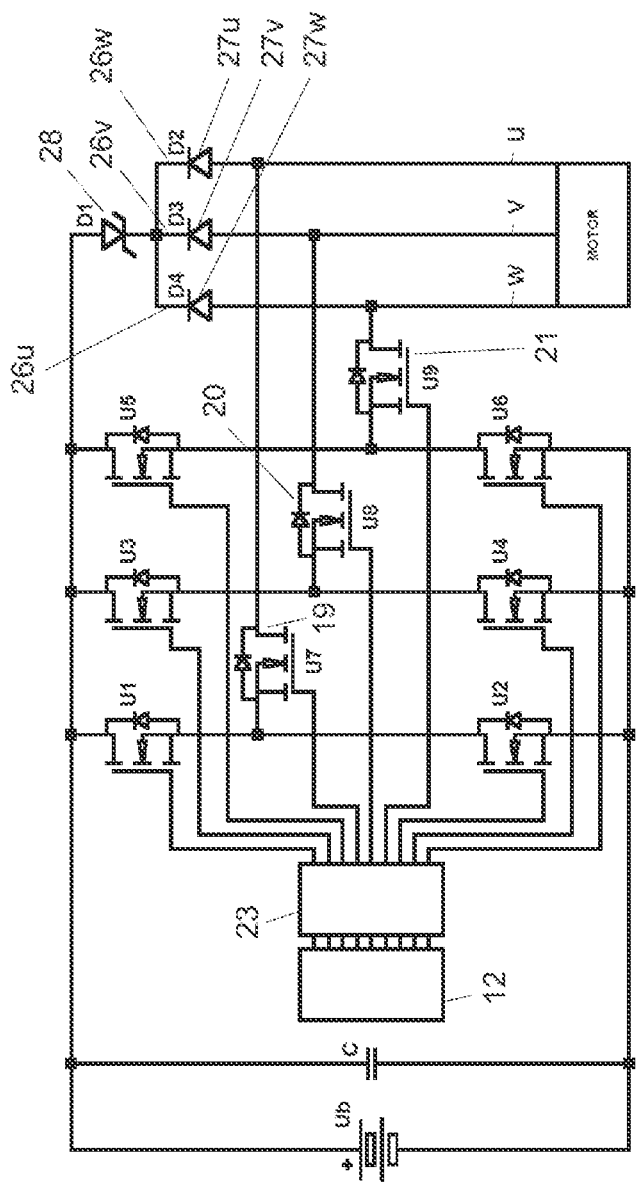
FIG. 3 is a further circuit for actuating a permanently excited synchronous motor with six MOSFETs for controlling the motor current and a protective device.

FIG. 3 shows a further embodiment of the circuit which corresponds essentially to the circuit in FIG. 2. However, a suppressor diode is not used in the protective device 25, in each of the three current conducting paths 26u, 26v, 26w. A single suppressor diode 28 is provided which is arranged in the direction of current upstream of the division into the three current conducting paths. If a high induction current, at which the voltage threshold of the single suppressor diode is exceeded, occurs in one of the three windings u, v, w, the current is conducted past the corresponding safety switch 19, 20, 21 through the parallel connection to the diode 27u, 27v, 27w which is assigned to the respective phase, and to the single suppressor diode 28.

Figure 4:
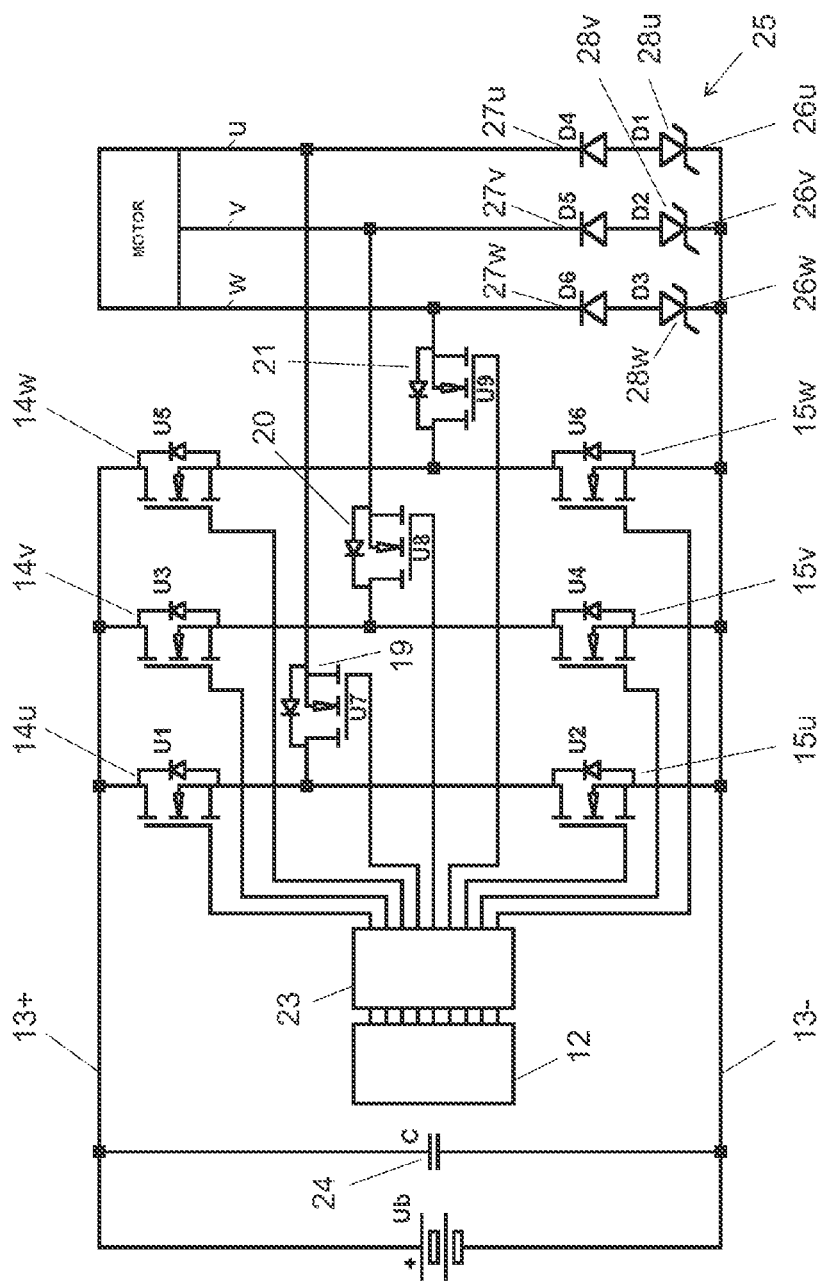
FIG. 4 is a third embodiment of a circuit for actuating a permanently excited synchronous motor with six MOSFETs for controlling the motor current and a protective device.

The exemplary embodiment shown in FIG. 4 differs from the example in FIG. 2 in that it is a source-to-motor configuration, and the safety switches 19, 20, 21 are therefore installed the other way round. The diodes of the MOSFETs of the safety switches 19, 20, 21 are connected in the forward conducting direction with respect to a possible induction current. During operation, the individual MOSFETs of the third group are continuously switched to a conductive mode as long as the steering device is active and no disruption occurs. In the case of a short-circuit smoothing capacitor 24, the two lines 13+ and 13− are conductively connected to one another. In this case, in the event of a rotation of electric motor caused by the external torque of the steering column an induction voltage would be produced in the windings u, v and w. The induction current flows out of a winding via the lines to the MOSFETs of the third group 19, 20, 21 whose diodes are switched in the forward conducting direction, to the MOSFETs of the first group 14u, 14v, 14w, the short-circuit capacitor 24 and to the MOSFETs of the second group 15u, 15v, 15w and back to the safety switches 19, 20, 21 which interrupt the circuit.

As already described above, each safety switch 19, 20, 21 has a protective device 25. The protective devices 25 are arranged in current conducting paths 26u, 26v, 26w which connect the negative supply line 13−, which is connected to the negative pole, to a common connecting point of the corresponding semiconductor switch 19, 20, 21 and of the associated motor winding u, v, w (load). The protective device 25 comprises in each case the diode 27u, 27v, 27w, which is connected in the forward conducting direction of a possible induction current, and in each case a unidirectional suppressor diode 28u, 28v, 28w, which is arranged in series with respect to the latter and connected in the reverse direction of a possible induction current. If a high induction current, at which the voltage threshold of the suppressor diodes is exceeded, occurs, the current is conducted past the corresponding safety switch 19, 20, 21 through the parallel connection.

Figure 5:
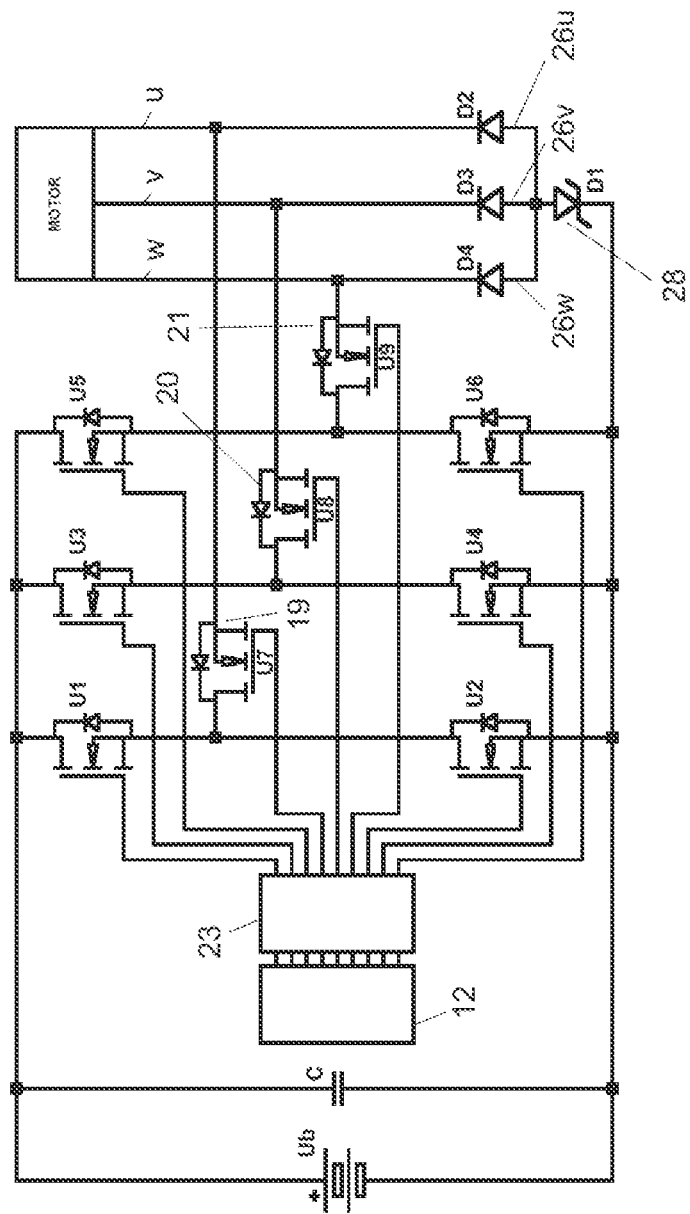
FIG. 5 is a fourth embodiment of a circuit for actuating a permanently excited synchronous motor with a protective device.

FIG. 5 shows a further exemplary embodiment which corresponds essentially to the circuit in FIG. 4, wherein, in a way analogous to the examples in FIGS. 2 and 3, only a single suppressor diode 28 is provided, which suppressor diode 28 is arranged upstream, in the direction of a possible induction current, of the division into the three current conducting paths 26u, 26v, 26w. If a high induction current, at which the voltage threshold of the single suppressor diode 28 is exceeded, occurs in one of the three windings u, v, w, the current is conducted past the corresponding safety switch 19, 20, 21 through the parallel connection to the diode 27u, 27v, 27w which is assigned to the phase, and to the single suppressor diode 28.

What is claimed is:

1. An electromechanical motor vehicle power steering system for a motor vehicle, comprising:
a controller,
supply lines connected to an onboard DC power supply of a motor vehicle,
a multiphase, permanently excited electric motor operatively connected to the controller and the supply lines,
wherein the electric motor comprises at least three phase windings that are connected to a driver circuit via lines,
wherein the driver circuit connects each of the lines to a positive supply line of the supply lines via a respectively first MOSFET of a first group and to a negative supply line of the supply lines via a respectively second MOSFET of a second group, in accordance with the controller, and
wherein each of the lines has a MOSFET as a safety switch that is arranged with a body diode in a forward conducting direction with respect to the onboard DC power supply,
wherein each safety switch has a protective device that comprises at least one suppressor diode that is connected in parallel with the respective safety switch and arranged in the forward conducting direction with respect to the onboard DC power supply, and for each phase winding a diode that is connected in series with respect to the at least one suppressor diode and in a reverse direction with respect to the onboard DC power supply.

2. The electromechanical motor vehicle power steering system of claim 1 wherein each suppressor diode is unidirectional.

3. The electromechanical motor vehicle power steering system of claim 1 wherein each suppressor diode is configured such that when an induction current which exceeds a voltage threshold is present, the current is conducted past the safety switches.

4. The electromechanical motor vehicle power steering system of claim 1 wherein with respect to the onboard DC power supply the MOSFETs of the first group and of the second group are arranged with their body diodes in the reverse direction.

5. The electromechanical motor vehicle power steering system of claim 1 wherein the protective devices are arranged in current conducting paths which connect the positive supply line to a common connecting point of the corresponding safety switch and of the associated motor winding.

6. The electromechanical motor vehicle power steering system of claim 1 wherein the protective devices are arranged in current conducting paths which connect the negative supply line of the supply lines to a common connecting point of the corresponding safety switch and of the associated motor winding.

7. The electromechanical motor vehicle power steering system of claim 1 wherein the electromechanical motor vehicle power steering system has, for each phase winding, a suppressor diode in the current conducting paths.

8. The electromechanical motor vehicle power steering system of claim 1 wherein the diodes of each protective device that are connected in the reverse direction with respect to the onboard DC power supply are Schottky diodes.

9. The electromechanical motor vehicle power steering system of claim 1 comprising a smoothing capacitor.

10. The electromechanical motor vehicle power steering system of claim 9 wherein the smoothing capacitor is disposed between the supply lines and suppresses high-frequency reactions from the multiphase, permanently excited electric motor and from the MOSFETs.

11. An electromechanical motor vehicle power steering system for a motor vehicle, comprising:
a controller;
supply lines connected to an onboard DC power supply of a motor vehicle;
a multiphase, permanently excited electric motor operatively connected to the controller and the supply lines, wherein the electric motor comprises at least three phase windings that are connected to a driver circuit via lines, wherein the driver circuit connects each of the lines to a positive supply line of the supply lines via a respectively first MOSFET of a first group and to a negative supply line of the supply lines via a respectively second MOSFET of a second group, in accordance with the controller, wherein each of the lines has a MOSFET as a safety switch that is arranged with a body diode in a forward conducting direction with respect to the onboard DC power supply; and
a single suppressor diode which is arranged upstream of a common connecting point of the current conducting paths,
wherein each safety switch has a protective device that comprises for each phase winding a diode that is connected downstream of the single suppressor diode and in a reverse direction with respect to the onboard DC power supply.

12. The electromechanical motor vehicle power steering system of claim 11 wherein the diodes of each protective device that are connected in the reverse direction with respect to the onboard DC power supply are Schottky diodes.

13. The electromechanical motor vehicle power steering system of claim 11 comprising a smoothing capacitor.

14. The electromechanical motor vehicle power steering system of claim 13 wherein the smoothing capacitor is disposed between the supply lines and suppresses high-frequency reactions from the multiphase, permanently excited electric motor and from the MOSFETs.

* * * * *